United States Patent
Okamoto et al.

(10) Patent No.: US 10,537,017 B2
(45) Date of Patent: Jan. 14, 2020

(54) PRINTED CIRCUIT BOARD AND ELECTRONIC COMPONENT

(71) Applicants: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

(72) Inventors: Kohei Okamoto, Koka (JP); Kousuke Miura, Koka (JP); Hiroshi Ueda, Koka (JP); Takashi Kasuga, Osaka (JP); Kazuhiro Miyata, Osaka (JP)

(73) Assignees: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 0 days.

(21) Appl. No.: 15/752,383

(22) PCT Filed: Aug. 1, 2016

(86) PCT No.: PCT/JP2016/072504
§ 371 (c)(1),
(2) Date: Feb. 13, 2018

(87) PCT Pub. No.: WO2017/029972
PCT Pub. Date: Feb. 23, 2017

(65) Prior Publication Data
US 2019/0008035 A1 Jan. 3, 2019

(30) Foreign Application Priority Data
Aug. 17, 2015 (JP) .................. 2015-160591

(51) Int. Cl.
*H05K 1/02* (2006.01)
*H05K 1/09* (2006.01)
(Continued)

(52) U.S. Cl.
CPC .......... *H05K 1/0269* (2013.01); *H05K 1/028* (2013.01); *H05K 1/092* (2013.01); *H05K 1/097* (2013.01);
(Continued)

(58) Field of Classification Search
CPC .. H05K 1/0269; H05K 3/1291; H05K 3/1208; H05K 1/092; H05K 1/181;
(Continued)

(56) References Cited

U.S. PATENT DOCUMENTS 4,248,921 A * 2/1981 Steigerwald ......... B23K 35/001
174/257
4,404,237 A * 9/1983 Eichelberger .......... H05K 3/246
338/308
(Continued)

FOREIGN PATENT DOCUMENTS

CN 102387666 A 3/2012
CN 102415222 A 4/2012
(Continued)

OTHER PUBLICATIONS

U.S. Appl. No. 15/752,359, filed Feb. 13, 2018, Okamoto et al.
(Continued)

*Primary Examiner* — Ishwarbhai B Patel
(74) *Attorney, Agent, or Firm* — Drinker Biddle & Reath LLP

(57) ABSTRACT

A printed circuit board according to an embodiment of the present invention includes a base film containing, as a main component, a polyimide and a conductive pattern disposed on at least one surface of the base film. The conductive
(Continued)

pattern includes a copper particle bond layer which is fixed to the base film. An external transmittance for a wavelength of 500 nm in a conductive pattern non-formed region of the base film is 70% or less of an internal transmittance for a wavelength of 500 nm in a middle layer portion of the base film.

5 Claims, 4 Drawing Sheets

(51) Int. Cl.
    *H05K 1/18*     (2006.01)
    *H05K 3/06*     (2006.01)
    *H05K 3/12*     (2006.01)
    *H05K 1/11*     (2006.01)
    *H05K 1/03*     (2006.01)
    *H05K 3/18*     (2006.01)

(52) U.S. Cl.
    CPC ............ *H05K 1/181* (2013.01); *H05K 3/064* (2013.01); *H05K 3/1208* (2013.01); *H05K 3/1291* (2013.01); *H05K 1/03* (2013.01); *H05K 1/0346* (2013.01); *H05K 1/11* (2013.01); *H05K 3/181* (2013.01); *H05K 2201/0108* (2013.01); *H05K 2201/0154* (2013.01); *H05K 2203/072* (2013.01)

(58) Field of Classification Search
    CPC ........ H05K 3/064; H05K 3/181; H05K 1/028; H05K 1/03; H05K 3/00; H05K 2201/0108; H05K 2201/0154; H05K 1/0346; H05K 2203/072
    See application file for complete search history.

(56) References Cited

U.S. PATENT DOCUMENTS

| | | |
|---|---|---|
| 2010/0189974 A1 | 7/2010 | Ochi et al. |
| 2010/0208250 A1 | 8/2010 | Ihara et al. |
| 2010/0263206 A1* | 10/2010 | Toyoda ............... G01N 21/94 29/829 |
| 2011/0005812 A1 | 1/2011 | Shimokawa et al. |
| 2011/0143132 A1* | 6/2011 | Jung ................. G02F 1/133305 428/339 |
| 2012/0031656 A1 | 2/2012 | Oka et al. |
| 2012/0055697 A1* | 3/2012 | Okamoto ............ G11B 5/4833 174/250 |
| 2013/0058062 A1* | 3/2013 | Tachibana ......... H01L 23/49827 361/783 |
| 2014/0036200 A1 | 2/2014 | Jung et al. |
| 2014/0216799 A1* | 8/2014 | Kawato ................ C09D 11/52 174/257 |
| 2014/0308460 A1* | 10/2014 | Uchida ................. H05K 3/105 427/557 |
| 2015/0183932 A1* | 7/2015 | Katayama ................ C08J 5/18 257/40 |
| 2016/0157344 A1* | 6/2016 | Wang .................... H05K 3/182 174/257 |

FOREIGN PATENT DOCUMENTS

| | | |
|---|---|---|
| JP | H02-000765 U | 1/1990 |
| JP | H03-82750 A | 4/1991 |
| JP | H09-136378 A | 5/1997 |
| JP | 2004-195774 A | 7/2004 |
| JP | 2012-59756 A | 3/2012 |
| WO | WO-2009/004774 A1 | 1/2009 |

OTHER PUBLICATIONS

Written Opinion of International Searching Authority and its English translation for PCT/JP2016/072505 which corresponds to U.S. Appl. No. 15/752,359.
Written Opinion of International Searching Authority and its English translation for PCT/JP2016/072504 which corresponds to U.S. Appl. No. 15/752,383.
Office Action dated Nov. 23, 2018 that issued in U.S. Appl. No. 15/752,359.
U.S. Office Action of the U.S. Appl. No. 15/752,359, dated Apr. 17, 2019.
Notice of Allowability and the Notice of Allowance issued in U.S. Appl. No. 15/752,359 dated Sep. 5, 2019 attached.

* cited by examiner

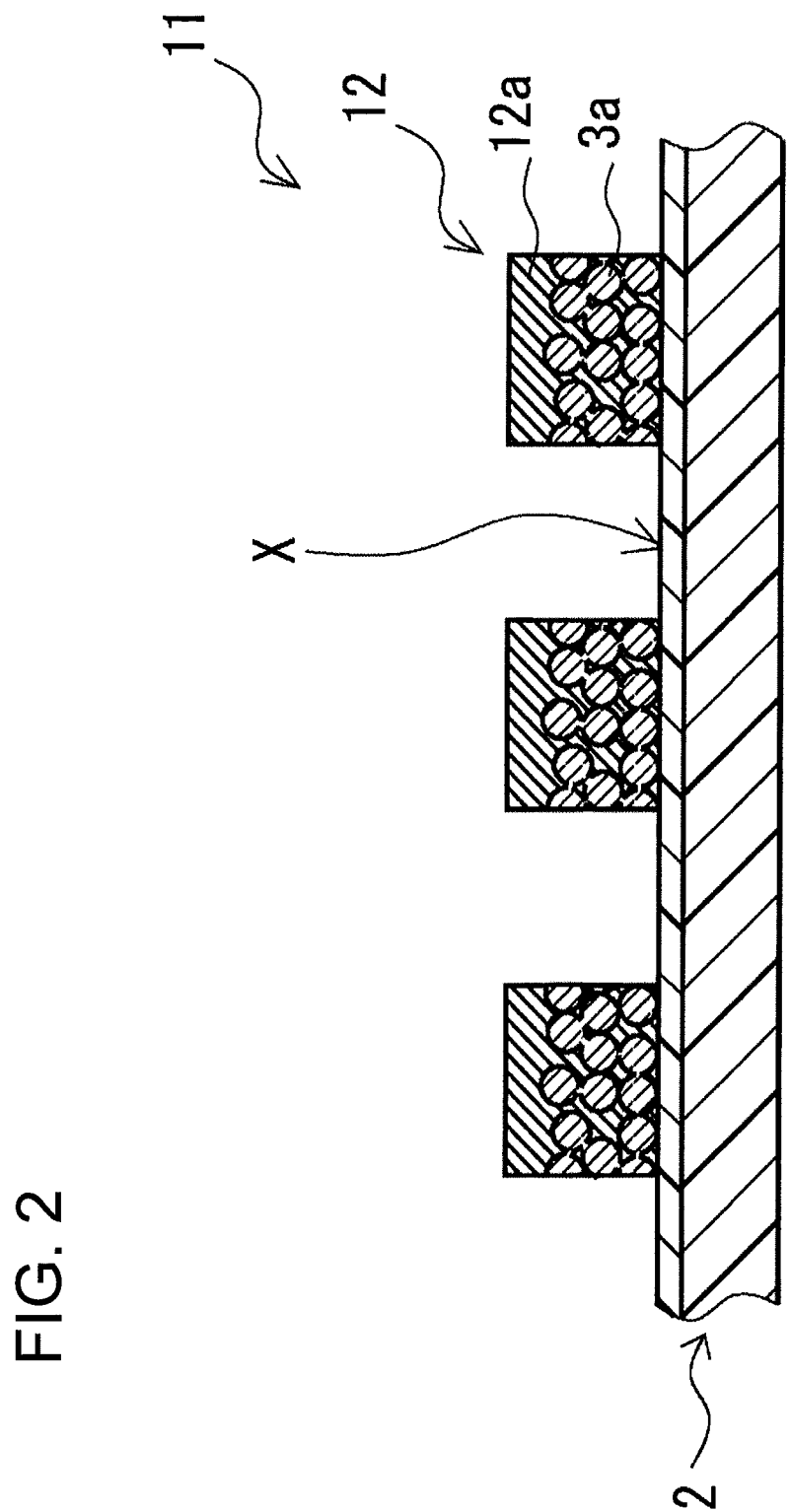

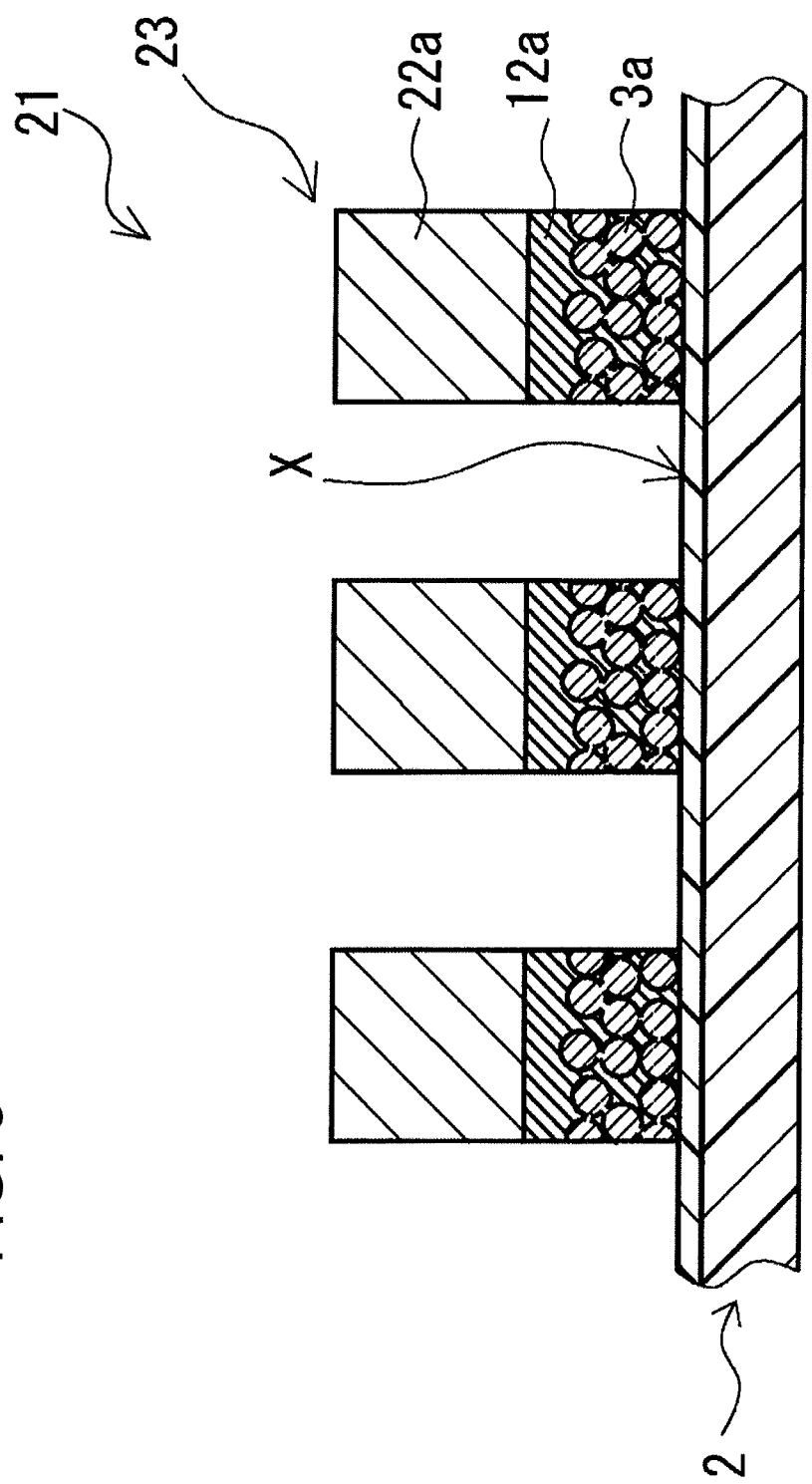

PRINTED CIRCUIT BOARD AND ELECTRONIC COMPONENT

TECHNICAL FIELD

The present invention relates to a printed circuit board and an electronic component.

The present application is based upon and claims the benefit of priority from Japanese Patent Application No. 2015-160591, filed Aug. 17, 2015, the entire contents of which are incorporated herein by reference.

BACKGROUND ART

There is a known printed circuit board which includes a base film and a conductive pattern disposed on one surface of the base film. Such a printed circuit board is fabricated, for example, by forming a seed layer with a thickness of 1 μm or less by a sputtering method on one surface of a base film, forming a metal plating layer by electroplating on one surface of the seed layer to obtain a metal layer, and etching the metal layer into a desired pattern (refer to Japanese Unexamined Patent Application Publication No. 9-136378).

Usually after formation of circuits, the printed circuit board is inspected to determine the presence or absence of circuit defects with an automated optical inspection system, and is then shipped as a product. Furthermore, in the inspection with the automated optical inspection system, the printed circuit board is irradiated with light, and the presence or absence of circuit defects is determined on the basis of the contrast of reflected light.

CITATION LIST

Patent Literature

PTL 1: Japanese Unexamined Patent Application Publication No. 9-136378

SUMMARY OF INVENTION

A printed circuit board according to an embodiment of the present invention includes a base film containing, as a main component, a polyimide and a conductive pattern disposed on at least one surface of the base film. The conductive pattern includes a copper particle bond layer which is fixed to the base film. An external transmittance for a wavelength of 500 nm in a conductive pattern non-formed region of the base film is 70% or less of an internal transmittance for a wavelength of 500 nm in a middle layer portion of the base film.

Furthermore, an electronic component according to another embodiment of the present invention includes the printed circuit board and an element mounted on the printed circuit board.

BRIEF DESCRIPTION OF DRAWINGS

FIG. 2 is a schematic cross-sectional view showing a printed circuit board according to an embodiment which is different from the printed circuit board shown in FIG. 1.

FIG. 3 is a schematic cross-sectional view showing a printed circuit board according to an embodiment which is different from the printed circuit board shown in FIG. 1 or 2.

DESCRIPTION OF EMBODIMENTS

Figure 1:
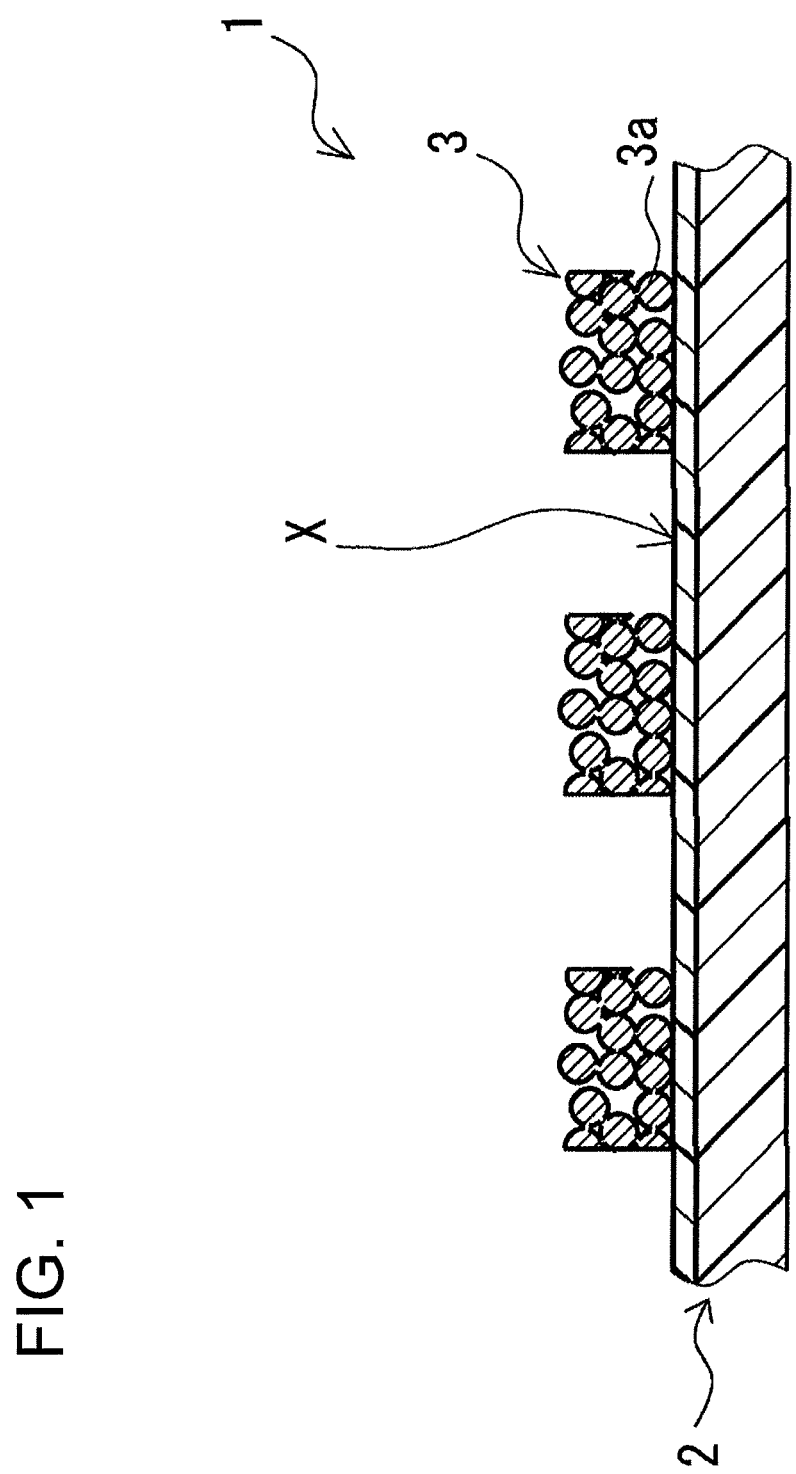
FIG. 1 is a schematic cross-sectional view of a printed circuit board according to an embodiment of the present invention.

Problems to be Solved by the Present Disclosure

In an existing printed circuit board, such as the one described above, a base film is formed by using a transparent synthetic resin as a main component, and therefore, light irradiated on the printed circuit board is easily transmitted through the base film. As a result, the back surface side of the printed circuit board is seen through from the front, which is likely to lead to inspection errors. Furthermore, as reduction in the thickness of the base film is promoted today, the rate of such inspection errors tends to increase.

The present invention has been made under these circumstances. It is an object of the invention to provide a printed circuit board which can reduce the inspection error rate in determination of circuit defects and an electronic component which can reduce the rate of occurrence of circuit defects.

Advantageous Effects of the Present Disclosure

A printed circuit board according to an embodiment of the present invention can reduce the inspection error rate in determination of circuit defects. Furthermore, an electronic component according to the present invention can reduce the rate of occurrence of circuit defects.

Description of Embodiments of the Present Invention

First, the embodiments of the present invention will be described below one by one.

A printed circuit board according to an embodiment of the present invention includes a base film containing, as a main component, a polyimide and a conductive pattern disposed on at least one surface of the base film. The conductive pattern includes a copper particle bond layer which is fixed to the base film. An external transmittance for a wavelength of 500 nm in a conductive pattern non-formed region of the base film is 70% or less of an internal transmittance for a wavelength of 500 nm in a middle layer portion of the base film.

In order to decrease the light transmittance of a base film, it is necessary to modify the composition of the base film or incorporate a pigment or the like into the base film. Such modification of the composition or incorporation of another substance tends to result in degradation in characteristics, such as heat resistance, of the base film. In contrast, in the printed circuit board, by setting the external transmittance for a wavelength of 500 nm in a conductive pattern non-formed region of the base film to be 70% or less of the internal transmittance for a wavelength of 500 nm in a middle layer portion of the base film, the external transmittance in the conductive pattern non-formed region of the base film can be decreased while preventing a decrease in the internal transmittance in the middle layer portion. That is, in the printed circuit board, unlike the existing base film in which the light transmittance of the whole is determined on the basis of modification of the composition of the base film or incorporation of another substance, the external transmittance in the conductive pattern non-formed region of the base film can be decreased while maintaining the material properties of the polyimide, which is a main component, and increasing the internal transmittance in the middle layer portion. Consequently, in the printed circuit board, while preventing degradation in quality by maintaining the material properties of the polyimide, it is possible to reduce the inspection error rate in determination of circuit defects by suppressing light, which is emitted from a circuit defect inspection system, from being transmitted to the back surface side.

Preferably, the middle layer portion of the base film is a portion excluding at least a modified surface layer. When the middle layer portion of the base film is a portion excluding at least a modified surface layer, the external transmittance can be decreased by modification of the surface layer, and it is possible to reliably obtain an effect of reducing the inspection error rate in determination of circuit defects of the printed circuit board.

Preferably, the base film does not substantially contain a pigment. When the base film does not substantially contain a pigment, it is possible to reduce the inspection error rate in determination of circuit defects while more reliably maintaining the material properties of the base film.

The external transmittance for a wavelength of 500 nm in the conductive pattern non-formed region of the base film is preferably 15% or less. When the external transmittance for a wavelength of 500 nm in the base film is equal to or less than the upper limit described above, it is possible to reliably reduce the inspection error rate in determination of circuit defects.

An electronic component according to an embodiment of the present invention includes the printed circuit board and an element mounted on the printed circuit board.

Since the electronic component includes the printed circuit board which can reduce the inspection error rate in determination of circuit defects, it is possible to reduce the rate of occurrence of circuit defects.

Note that, in the present invention, the term "main component" refers to a component whose content is the largest, for example, a component with a content of 50% by mass or more, preferably 80% by mass or more. The term "copper particle bond layer" refers to a layer including a structure in which a plurality of copper particles adhere and bond together. The expression "external transmittance of the base film" refers to a transmittance which takes into consideration surface reflection of the base film, and specifically means the ratio ($I/I_0$) of transmitted light intensity (I) to incident light intensity ($I_0$). Furthermore, the term "light intensity" refers to incident light flux per unit area. The expression "internal transmittance (T) of the base film" refers to the transmittance of the material by itself excluding a loss due to surface reflection of the base film, and is a value calculated according to the formula:

$$\log(T) = (\log T_1 - \log T_2) \times L/(d_2 - d_1)$$

in the case where the external transmittance ($T_1$) of a base film with an average thickness $d_1$ and the external transmittance ($T_2$) of a base film with an average thickness $d_2$ (where $d_2 > d_1$) having the same surface state are used, and L represents the average thickness of the base film.

The expression "middle layer portion of the base film" refers to a central portion in the thickness direction of the base film, and, for example, refers to a portion of the base film excluding a region extending from the surface of the base film to a depth of 500 nm, preferably a portion of the base film excluding a region extending from the surface of the base film to a depth of 200 nm. The term "modification" refers to the fact that the composition changes from other regions. The expression "does not substantially contain a pigment" refers to the fact that a pigment is not positively incorporated, except for inevitable inclusion, and for example, that the pigment content is 1% by mass or less, preferably 0.1% by mass or less, and more preferably 0.01% by mass or less.

Detailed Description of Embodiments of the Present Invention

Printed circuit boards according to the embodiments of the present invention will be described below with reference to the drawings appropriately.

First Embodiment

<Printed Circuit Board>

A printed circuit board 1 shown in FIG. 1 includes a base film 2 and a conductive pattern 3 disposed on one surface of the base film 2. The printed circuit board 1 shown in FIG. 1 is a flexible printed circuit board having flexibility.

(Base Film)

The base film 2 has an insulating property and flexibility. The base film 2 is formed as a single-layer body (single resin film, not including a plurality of resin films laminated together). In the printed circuit board 1, by using a polyimide as a main component, it is possible to improve the insulating property, flexibility, heat resistance, and the like of the base film 2. Furthermore, since the polyimide has high heat resistance, while preventing degradation in quality, such as heat deformation, of the base film 2, as will be described later, the external transmittance of the base film 2 can be easily and reliably adjusted by modifying a surface layer of the base film 2.

The lower limit of the average thickness of the base film 2 is preferably 5 μm, more preferably 12 μm, and still more preferably 25 μm. On the other hand, the upper limit of the average thickness of the base film 2 is preferably 2 mm, more preferably 1.6 mm, still more preferably 500 μM, and particularly preferably 200 μm. When the average thickness of the base film 2 is less than the lower limit, there is a concern that the insulating property and mechanical strength may become insufficient. Contrarily, when the average thickness of the base film 2 exceeds the upper limit, there is a concern that the requirement for reduction in thickness may not be satisfied. On the other hand, when the average thickness of the base film 2 is within the range described above, reduction in thickness can be promoted while suppressing degradations in the insulating property and mechanical strength of the base film 2. Furthermore, in the printed circuit board 1, even when the average thickness of the base film 2 is decreased in the range described above, the external transmittance of the base film 2 can be easily and reliably decreased by modifying the surface layer. Note that the term "average thickness" refers to an average of the values measured at arbitrary ten points.

Furthermore, a surface of the base film 2, to which a copper particle bond layer 3a, which will be described later, is fixed, is preferably subjected to a hydrophilic treatment, in addition to modification of the surface layer of the base film 2. As the hydrophilic treatment, for example, a plasma treatment in which the fixing surface is made hydrophilic by irradiation with plasma, or alkaline treatment in which the fixing surface is made hydrophilic by using an alkaline solution can be used. By subjecting the fixing surface to a hydrophilic treatment, surface tension of an ink with respect to the fixing surface decreases, and therefore, the ink can be uniformly applied to the fixing surface. In particular, a plasma treatment is preferable as the hydrophilic treatment. In the printed circuit board 1, by performing a plasma treatment as the hydrophilic treatment and further by modifying the surface layer of the base film 2, which will be described later, the external transmittance of the base film 2 can be more reliably decreased. Furthermore, in the printed circuit board 1, it is also preferable to perform a blast treatment in addition to the plasma treatment. As the blast treatment, in particular, a wet blast treatment which is performed with inorganic particles being dispersed in a liquid is more preferable.

The base film 2 includes a surface layer that is modified during fixing of the copper particle bond layer 3a and a middle layer which is a portion excluding at least the surface layer that is modified (hereinafter, may also be referred to as the "modified surface layer"). Furthermore, the modified surface layer is formed in the entire region of the base film 2 when viewed in plan. Preferably, the arithmetic average roughness Ra of the base film 2 is not substantially changed by the modification. Preferably, the arithmetic average roughness Ra of one surface of the base film 2 after the modification is, for example, 0.03 to 0.12 μm. The term "modified surface layer" means a region of the base film 2 extending from the fixing surface for the copper particle bond layer 3a, with a certain thickness, and having a low transmittance. Accordingly, for example, in the case where a copper particle bond layer 3a is fixed to each of both surfaces of the base film 2, the modified surface layers may be present on both sides of the base film 2. On the other hand, in the case where the copper particle bond layer 3a is fixed to only one surface of the base film 2, the middle layer corresponds to a portion excluding the modified surface layer on the one surface side. In the printed circuit board 1, since the middle layer portion is set to be a portion excluding at least the modified surface layer of the base film 2 as described above, the external transmittance can be decreased by modifying the surface layer, and it is possible to reliably obtain an effect of reducing the inspection error rate in determination of circuit defects.

The lower limit of the average thickness of the modified surface layer is preferably 5 nm, and more preferably 10 nm. On the other hand, the upper limit of the average thickness of the modified surface layer is preferably 100 nm, and more preferably 50 nm. When the average thickness of the modified surface layer is less than the lower limit, there is a concern that the external transmittance of the base film 2 may not be decreased sufficiently. Contrarily, when the average thickness of the modified surface layer exceeds the upper limit, there is a concern that the thickness of the middle layer which is important for maintaining the quality of the base film 2 may be decreased unnecessarily.

Preferably, the base film 2 does not substantially contain a pigment. In the printed circuit board 1, when the base film 2 does not substantially contain a pigment, it is possible to reduce the inspection error rate in determination of circuit defects while more reliably maintaining the material properties of the base film 2.

The upper limit of the external transmittance for a wavelength of 500 nm in a conductive pattern non-formed region X (hereinafter, may also be referred to as the "non-formed region X") of the base film 2 is 70% of the internal transmittance for a wavelength of 500 nm in the middle layer portion of the base film 2, and is preferably 60%, and more preferably 50%. When the external transmittance exceeds the upper limit, there is a concern that transmission of light emitted from a circuit defect inspection system may not be suppressed sufficiently. Furthermore, the lower limit of the external transmittance for a wavelength of 500 nm in the non-formed region X of the base film 2 is not particularly limited, but can be, for example, 10% of the internal transmittance for a wavelength of 500 nm in the middle layer portion of the base film 2.

The upper limit of the external transmittance for a wavelength of 600 nm in the non-formed region X of the base film 2 is preferably 70%, more preferably 60%, and still more preferably 50% of the internal transmittance for a wavelength of 600 nm in the middle layer portion of the base film 2. When the external transmittance exceeds the upper limit, there is a concern that transmission of light emitted from a circuit defect inspection system may not be suppressed sufficiently. Furthermore, the lower limit of the external transmittance for a wavelength of 600 nm in the non-formed region X of the base film 2 is not particularly limited, but can be, for example, 10% of the internal transmittance for a wavelength of 600 nm in the middle layer portion of the base film 2.

The upper limit of the external transmittance for a wavelength of 500 nm in the non-formed region X of the base film 2 is preferably 15%, more preferably 12%, and still more preferably 10%. When the external transmittance exceeds the upper limit, there is a concern that transmission of light emitted from a circuit defect inspection system may not be suppressed sufficiently. Since the external transmittance is preferably as low as possible, the lower limit of the external transmittance is not particularly limited, but can be, for example, 1%.

The upper limit of the external transmittance for a wavelength of 600 nm in the non-formed region X of the base film 2 is preferably 45%, more preferably 40%, and still more preferably 35%. When the external transmittance exceeds the upper limit, there is a concern that transmission of light emitted from a circuit defect inspection system may not be suppressed sufficiently. Since the external transmittance is preferably as low as possible, the lower limit of the external transmittance is not particularly limited, but can be, for example, 1%.

The lower limit of the internal transmittance for a wavelength of 500 nm in the middle layer portion of the base film 2 is preferably 20%, and more preferably 25%. On the other hand, the upper limit of the internal transmittance is preferably 40%, and more preferably 35%. When the internal transmittance is less than the lower limit, there is a concern that material properties may not be exhibited sufficiently because relatively large amounts of impurities and the like are included in the base film 2. Contrarily, when the internal transmittance exceeds the upper limit, there is a concern that it may become difficult to manufacture the base film 2.

(Conductive Pattern)

The conductive pattern 3 includes a copper particle bond layer 3a fixed to the base film 2. In particular, in this embodiment, the conductive pattern 3 consists of only the copper particle bond layer 3a. The conductive pattern 3 is obtained by forming a copper particle bond layer 3a on the entire one surface of the base film 2, followed by patterning the copper particle bond layer 3a. As the formation method for the copper particle bond layer 3a, as will be described later, a method in which an ink containing copper particles is applied to one surface of the base film 2, followed by firing may be used. In this case, the copper particle bond layer 3a is formed as a copper particle sintered layer. As the patterning method of forming the conductive pattern 3, for example, a method (subtractive method) in which the copper particle bond layer 3a formed on the entire one surface of the base film 2 is masked with a resist pattern or the like and etching is performed can be used. Since the conductive pattern 3 includes such a copper particle bond layer 3a, conduction can be improved while suppressing manufacturing costs. Furthermore, since the conductive pattern 3 includes such a copper particle bond layer 3a, a modified surface layer can be formed in the base film 2.

The lower limit of the mean size of copper particles constituting the copper particle bond layer 3a is preferably 1 nm, more preferably 10 nm, and still more preferably 30 nm. On the other hand, the upper limit of the mean particle size of the copper particles is preferably 500 nm, more preferably 300 nm, and still more preferably 100 nm. When the mean particle size of the copper particles is less than the lower limit, there is a concern that the dispersibility and stability of copper particles in the ink used during formation of the copper particle bond layer 3a may be decreased. Contrarily, when the mean particle size of the copper particles exceeds the upper limit, there is a concern that the copper particles may be likely to be precipitated and that the density of the copper particles may become non-uniform when the ink is applied. Note that the term "mean particle size" refers to a mean particle size represented by the volume median diameter D50 of the particle size distribution of copper particles in a dispersion liquid.

The lower limit of the average thickness of the copper particle bond layer 3a is preferably 10 nm, more preferably 50 nm, and still more preferably 100 nm. On the other hand, the upper limit of the average thickness of the copper particle bond layer 3a is preferably 1 μm, more preferably 700 nm, and still more preferably 500 nm. When the average thickness of the copper particle bond layer 3a is less than the lower limit, there is a concern that breaks may occur in the copper particle bond layer 3a when viewed in plan, and it may become difficult to modify the surface of the base film 2 over the entire region. Contrarily, when the average thickness of the copper particle bond layer 3a exceeds the upper limit, there is a concern that it may take time to remove the copper particle bond layer 3a between conductive patterns 3 when a semi-additive method is used for interconnection formation, and productivity may be decreased.

The lower limit of the separation strength between the base film 2 and the copper particle bond layer 3a is preferably 1 N/cm, more preferably 1.5 N/cm, still more preferably 2 N/cm, and particularly preferably 5 N/cm. By setting the separation strength to be equal to or more than the lower limit, it is possible to fabricate a printed circuit board 1 having high electrical connection reliability. On the other hand, the upper limit of the separation strength is not particularly limited, but can be, for example, about 20 N/cm. The separation strength can be controlled, for example, by the amount of copper particles fixed to the base film 2, the size of copper particles in an ink, which will be described later, the firing temperature and firing time during firing a coating film, which will be described later, and the like.

The upper limit of the lightness L* of the non-formed region X of the base film 2 is preferably 60, more preferably 55, and still more preferably 50. When the lightness L* of the non-formed region X exceeds the upper limit, there is a concern that it may not be possible to sufficiently obtain a contrast between the non-formed region X and a surface of a circuit formed by the conductive pattern 3 (hereinafter, may be simply referred to as the "circuit") (one surface of the circuit), and it may not be possible to sufficiently reduce the inspection error rate in determination of circuit defects. The lower limit of the lightness L* of the non-formed region X is not particularly limited, but can be, for example, 30. Furthermore, the term "lightness" means the lightness defined by the L*a*b* and refers to a value conforming to JIS-Z8781-4 (2013).

The upper limit of the chromaticity a* of the non-formed region X of the base film 2 is preferably 30, more preferably 25, and still more preferably 20. When the chromaticity a* of the non-formed region X exceeds the upper limit, there is a concern that it may not be possible to sufficiently obtain a contrast between the non-formed region X and the surface of the circuit, and it may not be possible to sufficiently reduce the inspection error rate in determination of circuit defects. The lower limit of the chromaticity a* of the non-formed region X is not particularly limited, but can be, for example, 10. Furthermore, the term "chromaticity" means the chromaticity defined by the L*a*b* and refers to a value conforming to JIS-Z8781-4 (2013).

The lower limit of the chromaticity b* of the non-formed region X of the base film 2 is preferably 18, more preferably 25, still more preferably 30, and particularly preferably 34. When the chromaticity b* of the non-formed region X is less than the lower limit, there is a concern that it may not be possible to sufficiently obtain a contrast between the non-formed region X and the surface of the circuit, and it may not be possible to sufficiently reduce the inspection error rate in determination of circuit defects. The upper limit of the chromaticity b* of the non-formed region X is not particularly limited, but can be, for example, 40.

The lower limit of the absolute value of the difference between the lightness L* of the surface of the circuit and the lightness L* of the non-formed region X is preferably 15 and more preferably 20. When the absolute value of the difference in the lightness L* is less than the lower limit, there is a concern that it may not be possible to sufficiently reduce the inspection error rate in determination of circuit defects. The upper limit of the absolute value of the difference in the lightness L* is not particularly limited, but can be, for example, 40.

Furthermore, the absolute value of the difference between the chromaticity a* of the surface of the circuit and the chromaticity a* of the non-formed region X can be, for example, 4 to 10. Moreover, the absolute value of the difference between the chromaticity b* of the surface of the circuit and the chromaticity b* of the non-formed region X can be, for example, 3 to 20. In the printed circuit board 1, by setting the absolute value of the difference in the lightness L* to be in the range described above, and also by adjusting the absolute values of the differences in the chromaticity a* and the chromaticity b* to be in the ranges described above, it is possible to easily and reliably reduce the inspection error rate in determination of circuit defects.

<Advantages>

In order to decrease the light transmittance of a base film, it is necessary to modify the composition of the base film or incorporate a pigment or the like into the base film. Such modification of the composition or incorporation of another substance tends to result in degradation in characteristics, such as heat resistance, of the base film. In contrast, in the printed circuit board 1, by setting the external transmittance for a wavelength of 500 nm in the non-formed region X of the base film 2 to be 70% or less of the internal transmittance for a wavelength of 500 nm in the middle layer portion of the base film 2, the external transmittance in the non-formed region X of the base film 2 can be decreased while preventing a decrease in the internal transmittance in the middle layer portion. That is, in the printed circuit board 1, unlike the existing base film in which the light transmittance of the whole is determined on the basis of modification of the composition of the base film or incorporation of another substance, the external transmittance in the non-formed region X of the base film 2 can be decreased while maintaining the material properties of the polyimide, which is a main component, and increasing the internal transmittance in the middle layer portion. Consequently, in the printed circuit board 1, while preventing degradation in quality by maintaining the material properties of the polyimide, it is possible to reduce the inspection error rate in determination of circuit defects by suppressing light, which is emitted from a circuit defect inspection system, from being transmitted to the back surface side. Furthermore, since the modified surface layer is formed by fixing of the copper particle bond layer 3a, it is considered that copper oxide based on oxidation of copper particles is dispersed in the modified surface layer. Accordingly, in the printed circuit board 1, in addition to the effect of reducing inspection error rate in determination of circuit defects due to modification of the surface layer, dispersion of copper oxide due to the modification, makes it easy to more firmly fix the copper particle bond layer 3a to the base film 2.

Second Embodiment

<Printed Circuit Board>

A printed circuit board 11 shown in FIG. 2 is a flexible printed circuit board having flexibility. The printed circuit board 11 shown in FIG. 2 includes a base film 2 and a conductive pattern 12 disposed on one surface of the base film 2. The printed circuit board 11 shown in FIG. 2 is the same as the printed circuit board 1 shown in FIG. 1 except that the conductive pattern 12 includes a metal plating layer 12a on the outer surface of the copper particle bond layer 3a of the printed circuit board 1 shown in FIG. 1. Furthermore, as the patterning method of forming the conductive pattern 12, for example, a subtractive method can be used, as in the printed circuit board 1 shown in FIG. 1. The base film 2 and the copper particle bond layer 3a in the printed circuit board 11 are the same as those in the printed circuit board 1 shown in FIG. 1. Accordingly, they are denoted by the same reference signs, and a description thereof is omitted.

(Metal Plating Layer)

The metal plating layer 12a is formed by filling voids of the copper particle bond layer 3a with a plating metal and depositing the plating metal on one surface of the copper particle bond layer 3a. Furthermore, all the voids of the copper particle bond layer 3a are filled with the plating metal. In the printed circuit board 11, since the voids of the copper particle bond layer 3a are filled with the plating metal, it is possible to suppress the void portions of the copper particle bond layer 3a from acting as starting points for breakage to cause separation of the conductive pattern 12 from the base film 2. Furthermore, in the printed circuit board 11, since the voids of the copper particle bond layer 3a are filled with the plating metal, by performing a heat treatment after filling with the plating metal, modification of the base film 2 can be further promoted.

The plating method for forming the metal plating layer 12a is not particularly limited, and may be electroless plating or electroplating. It is preferable to use electroless plating by which the voids between the copper particles constituting the copper particle bond layer 3a can be more appropriately filled, and the effect of modifying the base film 2 is easily improved by performing a heat treatment after filling with the plating metal.

As the metal constituting the metal plating layer 12a, highly conductive copper, nickel, silver, or the like can be used. In consideration of adhesion with the copper particles, use of copper or nickel is preferable.

The lower limit of the average thickness of the metal plating layer 12a is preferably 50 nm, more preferably 100 nm, and still more preferably 200 nm. On the other hand, the upper limit of the average thickness of the metal plating layer 12a is preferably 2 µm, more preferably 1.5 µm, and still more preferably 1 µm. When the average thickness of the metal plating layer 12a is less than the lower limit, there is a concern that the voids of the copper particle bond layer 3a may not be sufficiently filled with a plating metal. Contrarily, when the average thickness of the metal plating layer 12a exceeds the upper limit, for example, in the case where the metal plating layer 12a is formed by electroless plating, there is a concern that a long time may be required for the electroless plating, resulting in a decrease in productivity.

In this embodiment, the metal plating layer 12a is formed by filling voids of the copper particle bond layer 3a with a plating metal and depositing the plating metal on one surface of the copper particle bond layer 3a. However, as long as the voids of the copper particle bond layer 3a are filled with the plating metal, the metal plating layer 12a is not necessarily deposited to the one surface of the copper particle bond layer 3a.

<Advantages>

In the printed circuit board 11, since the metal plating layer 12a is disposed on the outer surface of the copper particle bond layer 3a, by performing a heat treatment after filling with the plating metal, modification of the base film 2 can be promoted to further decrease the external transmittance of the base film 2.

Third Embodiment

<Printed Circuit Board>

A printed circuit board 21 shown in FIG. 3 is a flexible printed circuit board having flexibility. The printed circuit board 21 shown in FIG. 3 includes a base film 2 and a conductive pattern 23 disposed on one surface of the base film 2. The printed circuit board 21 shown in FIG. 3 is the same as the printed circuit board 1 shown in FIG. 1 except that the conductive pattern 23 includes a metal plating layer on the outer surface of the copper particle bond layer 3a of the printed circuit board 1 shown in FIG. 1. Furthermore, as the patterning method of forming the conductive pattern 23, for example, a subtractive method can be used, as in the printed circuit board 1 shown in FIG. 1. The base film 2 and the copper particle bond layer 3a in the printed circuit board 21 are the same as those in the printed circuit board 1 shown in FIG. 1. Accordingly, they are denoted by the same reference signs, and a description thereof is omitted.

(Metal Plating Layer)

The metal plating layer includes a first plating layer 12a and a second plating layer 22a. The first plating layer 12a has the same structure as the metal plating layer 12a shown in FIG. 2.

(Second Plating Layer)

The second plating layer 22a is disposed on one surface of the first plating layer 12a. The plating method for forming the second plating layer 22a is not particularly limited, and may be electroless plating or electroplating. It is preferable to use electroplating by which the thickness can be adjusted easily and accurately and the second plating layer 22a can be formed in a relatively short period of time.

As the metal constituting the second plating layer 22a, for example, highly conductive copper, nickel, silver, or the like may be used.

The average thickness of the second plating layer 22a is set depending on what type of printed circuit is fabricated and is not particularly limited. For example, the average thickness can be 1 to 100 μm.

<Advantages>

In the printed circuit board 21, since the metal plating layer includes the first plating layer 12a and the second plating layer 22a, the thickness of the conductive pattern 23 can be adjusted easily and reliably.

<Method for Manufacturing Printed Circuit Board>

Methods for manufacturing the printed circuit boards 1, 11, and 21 will be described below with reference to FIGS. 4A to 4D.

First, a method for manufacturing the printed circuit board 1 will be described with reference to FIGS. 4A and 4B. The method for manufacturing the printed circuit board 1 includes a step of forming a coating film 42 by applying an ink containing copper particles 41 to one surface of a base film 2, a step of forming a copper particle bond layer 3a (copper particle sintered layer) by firing the coating film 42, and a step of patterning the copper particle bond layer 3a.

(Coating Film Formation Step)

Figure 4A:
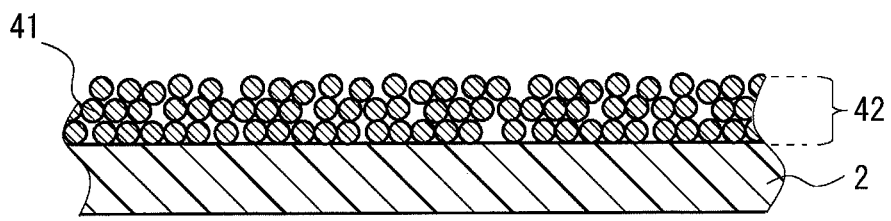
FIG. 4A is a schematic cross-sectional view showing a coating film formation step of a method for manufacturing a printed circuit board according to the present invention.

In the coating film formation step, as shown in FIG. 4A, a coating film 42 is formed by applying an ink containing copper particles 41 to one surface of a base film 2, followed by, for example, drying. The coating film 42 may contain a dispersion medium and the like of the ink.

(Copper Particles)

Copper particles 41 to be dispersed in the ink can be produced by a high-temperature treatment method, liquid-phase reduction method, gas-phase method, or the like. In particular, in the case where a liquid-phase reduction method is used, manufacturing costs can be further reduced, and the particle size of the copper particles 41 can be easily made uniform by stirring in the aqueous solution, or the like.

In order to produce copper particles 41 by the liquid-phase reduction method, for example, a water-soluble copper compound, which is a source for copper ions constituting the copper particles 41, and a dispersing agent are dissolved in water, and by adding a reducing agent thereinto, copper ions are subjected to reduction for a certain period of time. The copper particles 41 produced by the liquid-phase reduction method are spherical or granular in shape and uniform, and moreover, fine particles can be obtained. Examples of the water-soluble copper compound which is a source for copper ions include copper (II) nitrate ($Cu(NO_3)_2$), copper (II) sulfate pentahydrate ($CuSO_4.5H_2O$), and the like.

As the reducing agent, various reducing agents that are able to reduce and precipitate copper ions in a liquid-phase (aqueous solution) reaction system can be used. Examples of the reducing agent include sodium borohydride, sodium hypophosphite, hydrazine, transition metal ions such as trivalent titanium ions and divalent cobalt ions, ascorbic acid, reducing saccharides such as glucose and fructose, polyhydric alcohols such as ethylene glycol and glycerol, and the like. Among these, trivalent titanium ions are preferable as the reducing agent. Note that the liquid-phase reduction method in which trivalent titanium ions are used as the reducing agent is referred to as a "titanium redox process". In the titanium redox process, copper ions are reduced by oxidation-reduction when trivalent titanium ions are oxidized to tetravalent ions to precipitate copper particles 41. The copper particles 41 obtained by the titanium redox process have a small particle size and are uniform. Therefore, the copper particles 41 are packed at a higher density, and the coating film 42 can be made denser.

The particle size of the copper particles 41 can be controlled by adjusting the types and mixing ratios of the copper compound, dispersing agent, and reducing agent, and by adjusting the stirring rate, temperature, time, pH, and the like during reduction of the copper compound. The lower limit of the pH of the reaction system is preferably 7, and the upper limit of the pH of the reaction system is preferably 13. By setting the pH of the reaction system to be in the range described above, it is possible to obtain copper particles 41 having a very small particle size. At this time, by using a pH adjuster, the pH of the reaction system can be easily adjusted to be in the range described above. As the pH adjuster, a common acid or alkali, such as hydrochloric acid, sulfuric acid, nitric acid, sodium hydroxide, sodium carbonate, or ammonia, can be used. In particular, in order to prevent deterioration of surrounding members, preferred are nitric acid and ammonia that do not contain impurities, such as alkali metals, alkaline-earth metals, halogen elements, sulfur, phosphorus, and boron.

The lower limit of the content of the copper particles 41 in the ink is preferably 5% by mass, more preferably 10% by mass, and still more preferably 20% by mass. The upper limit of the content of the copper particles 41 in the ink is preferably 50% by mass, more preferably 40% by mass, and still more preferably 30% by mass. When the content of the copper particles 41 is equal to or more than the lower limit, the coating film 42 can be made denser. On the other hand, when the content of the copper particles 41 exceeds the upper limit, there is a concern that the thickness of the coating film 42 may become non-uniform.

(Other Components)

The ink may contain, in addition to the copper particles 41, a dispersing agent. The dispersing agent is not particularly limited, and various dispersing agents that are able to disperse the copper particles 41 satisfactorily can be used. The lower limit of the molecular weight of the dispersing agent is preferably 2,000. On the other hand, the upper limit of the molecular weight of the dispersing agent is preferably 30,000. By using a dispersing agent whose molecular weight is within the range described above, the copper particles 41 can be satisfactorily dispersed in the ink so that the quality of the coating film 42 can be dense and free from defects. When the molecular weight of the dispersing agent is less than the lower limit, there is a concern that it may not be possible to sufficiently obtain the effect of preventing aggregation of the copper particles 41 to maintain dispersion. On the other hand, when the molecular weight of the dispersing agent exceeds the upper limit, there is a concern that the dispersing agent may become excessively bulky and inhibit sintering of the copper particles 41, resulting in generation of voids, during firing of the coating film 42. Furthermore, when the dispersing agent is excessively bulky, there is a concern that the denseness of the coating film 42 may be decreased and that decomposition residues of the dispersing agent may decrease conductivity.

From the viewpoint of preventing deterioration of surrounding members, the dispersing agent preferably does not contain sulfur, phosphorus, boron, halogens, or alkalis. Preferred examples of the dispersing agent, whose molecular weight is within the range described above, include amine-based polymer dispersing agents, such as polyethyleneimine and polyvinylpyrrolidone; hydrocarbon-based polymer dispersing agents having carboxy groups in their molecules, such as polyacrylic acid and carboxymethyl cellulose; and polymer dispersing agents having polar groups, such as POVAL (polyvinyl alcohol), styrene-maleic acid copolymers, olefin-maleic acid copolymers, and copolymers having a polyethyleneimine moiety and a polyethylene oxide moiety in a molecule.

The dispersing agent may be dissolved in water or a water-soluble organic solvent, and the resultant solution may be added to the ink. In the case where the dispersing agent is added to the ink, the lower limit of the content of the dispersing agent is preferably 1 part by mass relative to 100 parts by mass of the copper particles 41. On the other hand, the upper limit of the content of the dispersing agent is preferably 60 parts by mass relative to 100 parts by mass of the copper particles 41. When the content of the dispersing agent is less than the lower limit, there is a concern that the effect of preventing aggregation of the copper particles 41 may become insufficient. Contrarily, when the content of the dispersing agent exceeds the upper limit, there is a concern that the excessive dispersing agent may inhibit sintering of the copper particles 41, resulting in generation of voids, during firing of the coating film 42. There is also a concern that decomposition residues of the dispersing agent may remain as impurities in the sintered body to decrease conductivity.

As the dispersion medium in the ink, for example, water can be used. In the case where water is used as the dispersion medium, the lower limit of the water content is preferably 20 parts by mass relative to 100 parts by mass of the copper particles 41. On the other hand, the upper limit of the water content is preferably 1,900 parts by mass relative to 100 parts by mass of the copper particles 41. Water, which is the dispersion medium, for example, sufficiently swells the dispersing agent, and satisfactorily disperses the copper particles 41 surrounded by the dispersing agent. However, when the water content is less than the lower limit, there is a concern that the effect of swelling the dispersing agent may become insufficient. Contrarily, when the water content exceeds the upper limit, the content of the copper particles 41 in the ink decreases, and there is a concern that it may not be possible to form a good sintered body having required thickness and density.

An organic solvent may be optionally added to the ink for the purpose of viscosity adjustment, vapor pressure adjustment, and the like. Various water-soluble organic solvents can be used as such an organic solvent. Specific examples thereof include alcohols, such as methyl alcohol, ethyl alcohol, n-propyl alcohol, isopropyl alcohol, n-butyl alcohol, isobutyl alcohol, sec-butyl alcohol, and tert-butyl alcohol; ketones, such as acetone and methyl ethyl ketone; esters of polyhydric alcohols, such as ethylene glycol and glycerol, and others; and glycol ethers, such as ethylene glycol monoethyl ether and diethylene glycol monobutyl ether.

In the case where an organic solvent is added to the ink, the lower limit of the content of the organic solvent is preferably 30 parts by mass relative to 100 parts by mass of the copper particles 41. On the other hand, the upper limit of the content of the organic solvent is preferably 900 parts by mass relative to 100 parts by mass of the copper particles 41. When the content of the organic solvent is less than the lower limit, there is a concern that the effect of adjusting the viscosity and vapor pressure of the ink may not be obtained sufficiently. Contrarily, when the content of the organic solvent exceeds the upper limit, for example, the effect of swelling the dispersing agent by water may become insufficient, and there is a concern that aggregation of the copper particles 41 may occur in the ink.

Furthermore, in the case where the copper particles 41 are produced by a liquid-phase reduction method, the copper particles 41 precipitated in a liquid-phase (aqueous solution) reaction system are subjected to steps of separation by filtration, washing, drying, disintegration, and the like, and the resultant powder can be used to prepare the ink. In this case, the copper particles 41 in the form of powder, a dispersion medium, such as water, and optionally, a dispersing agent, an organic solvent, and the like are mixed at predetermined proportions to thereby obtain an ink containing the copper particles 41. In this case, the liquid phase (aqueous solution) in which the copper particles 41 are precipitated is preferably used as a starting material to prepare the ink. Specifically, the liquid phase (aqueous solution) containing the precipitated copper particles 41 is subjected to processes, such as ultrafiltration, centrifugal separation, washing with water, and electrodialysis, to remove impurities, and optionally, is concentrated to remove water. Alternatively, conversely, after water is added to adjust the concentration of the copper particles 41, an organic solvent is further added as necessary at a predetermined ratio to prepare an ink containing the copper particles 41. This method can prevent generation of coarse and non-uniform particles due to aggregation of the copper particles 41 during drying and facilitate formation of a dense and uniform sintered body.

As the method of applying the ink in which the copper particles 41 are dispersed to one surface of the base film 2, a known coating method, such as spin coating, spray coating, bar coating, die coating, slit coating, roll coating, or dip coating, can be used. Furthermore, by using screen printing, a dispenser, or the like, the ink may be applied to only portions of one surface of the base film 2. After application of the ink, for example, by drying at a temperature equal to or higher than the room temperature, a coating film 42 is formed. The upper limit of the drying temperature is preferably 100° C. and more preferably 40° C. When the drying temperature exceeds the upper limit, there is a concern that cracks may occur in the coating film 42 due to sudden drying of the coating film 42.

(Copper Particle Bond Layer Formation Step)

In the copper particle bond layer formation step, a copper particle bond layer 3a is formed by firing the coating film 42.

Figure 4B:
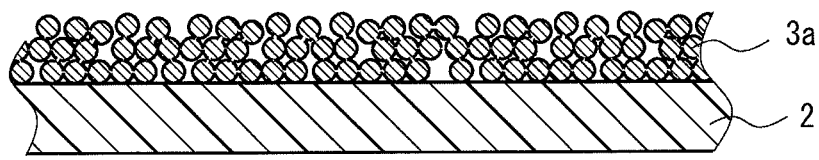
FIG. 4B is a schematic cross-sectional view showing a copper particle bond layer formation step of the method for manufacturing a printed circuit board according to the present invention.

In the copper particle bond layer formation step, as shown in FIG. 4B, firing sinters the copper particles 41 together and fixes the sintered body to one surface of the base film 2 to thereby form a copper particle bond layer 3a. The dispersing agent and other organic substances that can be contained in the ink are volatilized or decomposed by firing. Furthermore, it is considered that metal oxides, specifically, mainly copper oxide, originating from the copper particles 41 are dispersed by the firing into a surface layer of the base film 2, and thereby, the surface layer of the base film 2 is modified.

The firing is preferably performed in an atmosphere containing a certain amount of oxygen in order to promote oxidation of the copper particles 41 in the vicinity of the interface between the copper particle bond layer 3a and the base film 2 so that the surface layer of the base film 2 can be surely modified. In this case, the lower limit of the oxygen concentration in the firing atmosphere is preferably 1 ppm by volume and more preferably 10 ppm by volume. Furthermore, the upper limit of the oxygen concentration is preferably 10,000 ppm by volume and more preferably 1,000 ppm by volume. When the oxygen concentration is less than the lower limit, the amount of copper oxide generated in the vicinity of the interface between the copper particle bond layer 3a and the base film 2 decreases, and there is a concern that the surface layer of the base film 2 may not be sufficiently modified. Contrarily, when the oxygen concentration exceeds the upper limit, there is a concern that the conductivity of the copper particle bond layer 3a may be decreased by excessive oxidation of the copper particles 41.

The lower limit of the firing temperature is preferably 250° C., more preferably 300° C., and still more preferably 330° C. On the other hand, the upper limit of the firing temperature is preferably 500° C. and more preferably 400° C. When the firing temperature is less than the lower limit, the amounts of copper oxide and the like generated in the vicinity of the interface between the copper particle bond layer 3a and the base film 2 decrease, and there is a concern that the surface layer of the base film 2 may not be sufficiently modified. Contrarily, when the firing temperature exceeds the upper limit, there is a concern that the base film 2 may become deformed. However, the firing temperature is not limited as long as it is a temperature at which the sintered body of the copper particles 41 is fixed to the base film 2, and can be set appropriately in combination with the firing time, which will be described later, for example, at about 100° C. or lower. The lower limit of the firing time is preferably 80 minutes and more preferably 100 minutes. On the other hand, the upper limit of the firing time is preferably 180 minutes and more preferably 150 minutes. When the firing time is less than the lower limit, there is a concern that the surface layer of the base film 2 may not be sufficiently modified. Contrarily, when the firing time exceeds the upper limit, there is a concern that the base film 2 may become deformed. Particularly preferably, the firing temperature and the firing time each are set to be in the range described above. Thereby, the surface layer of the base film 2 can be sufficiently modified while preventing deformation of the base film 2, and the external transmittance of the base film 2 can be easily and reliably decreased.

(Patterning Step)

In the patterning step, by patterning the copper particle bond layer 3a formed in the copper particle bond layer formation step, a conductive pattern is formed on one surface of the base film 2. The printed circuit board 1 shown in FIG. 1 is obtained by the patterning step. In the patterning step, patterning can be performed by using a known etching technique.

Figure 4C:
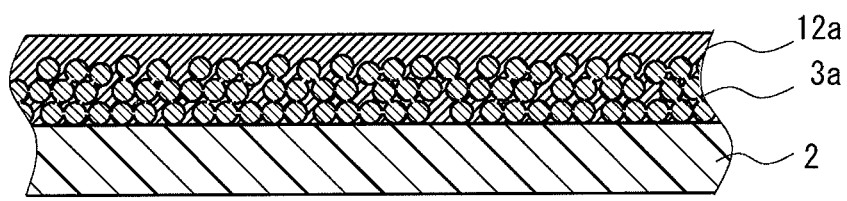
FIG. 4C is a schematic cross-sectional view showing a metal plating layer formation step of the method for manufacturing a printed circuit board according to the present invention.

Next, with reference to FIGS. 4A and 4C, a method for manufacturing the printed circuit board 11 will be described. The method for manufacturing the printed circuit board 11 includes a step of forming a coating film 42 by applying an ink containing copper particles 41 to one surface of a base film 2, a step of forming a copper particle bond layer 3a (copper particle sintered layer) by firing the coating film 42, a step of forming a metal plating layer 12a on the outer surface of the copper particle bond layer 3a, and a step of patterning a laminated body consisting of the copper particle bond layer 3a and the metal plating layer 12a.

The coating film formation step and the copper particle bond layer formation step in the method for manufacturing the printed circuit board 11 are the same as the coating film formation step and the copper particle bond layer formation step for the printed circuit board 1. Furthermore, patterning in the patterning step of the method for manufacturing the printed circuit board 11 can be performed by using a known etching technique as in the printed circuit board 1. Accordingly, the metal plating layer formation step only will be described below.

(Metal Plating Layer Formation Step)

In the metal plating layer formation step, voids of the copper particle bond layer 3a are filled with a plating metal and the plating metal is deposited on one surface of the copper particle bond layer 3a.

The plating method for forming the metal plating layer 12a is not particularly limited, and may be electroless plating or electroplating. It is preferable to use electroless plating by which the voids between the copper particles constituting the copper particle bond layer 3a can be more appropriately filled, and the effect of modifying the base film 2 is easily improved by performing a heat treatment after filling with the plating metal.

In the case where the electroless plating is used, its procedure is not particularly limited. For example, electroless plating may be performed through processes, such as a cleaner process, a water-washing process, an acid treatment process, a water-washing process, a pre-dip process, an activator process, a water-washing process, a reduction process, and a water-washing process, and by known methods.

In the case where the electroplating is used, its procedure is not particularly limited, and, for example, may be appropriately selected from known electroplating baths and plating conditions.

Furthermore, after the voids of the copper particle bond layer 3a are filled with a plating metal, a heat treatment is preferably performed. Since the amount of copper oxide in the vicinity of the interface between the copper particle bond layer 3a and the base film 2 is further increased by the heat treatment, modification of the surface layer of the base film 2 can be further promoted. Furthermore, the heat treatment temperature and the heat treatment time can be the same as the firing temperature and the firing time in the copper particle bond layer formation step for the printed circuit board 1.

Figure 4D:
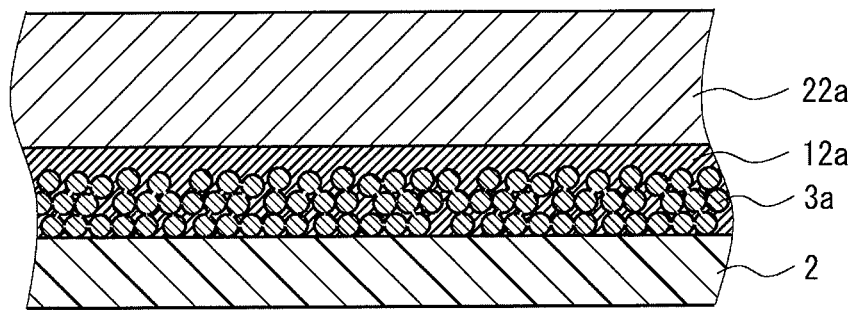
FIG. 4D is a schematic cross-sectional view showing a metal plating layer formation step according to an embodiment which is different from the metal plating layer formation step shown in FIG. 4C.

Next, with reference to FIGS. 4A and 4D, a method for manufacturing the printed circuit board 21 will be described. The method for manufacturing the printed circuit board 21 includes a step of forming a coating film 42 by applying an ink containing copper particles 41 to one surface of a base film 2, a step of forming a copper particle bond layer 3a (copper particle sintered layer) by firing the coating film 42, a step of forming a metal plating layer on the outer surface of the copper particle bond layer 3a, and a step of patterning a laminated body consisting of the copper particle bond layer 3a and the metal plating layer.

The coating film formation step and the copper particle bond layer formation step in the method for manufacturing the printed circuit board 21 are the same as the coating film formation step and the copper particle bond layer formation step for the printed circuit board 1. Furthermore, patterning in the patterning step of the method for manufacturing the printed circuit board 21 can be performed by using a known etching technique as in the printed circuit board 1. Accordingly, the metal plating layer formation step only will be described below.

(Metal Plating Layer Formation Step)

The metal plating layer formation step includes a step of forming a first plating layer 12a, which is the same as the metal plating layer 12a, and a step of forming a second plating layer 22a on a surface of the first plating layer 12a. The step of forming the first plating layer is the same as the step of forming the metal plating layer 12a, and therefore, a description thereof will be omitted.

The plating method for forming the second plating layer 22a is not particularly limited, and may be electroless plating or electroplating. It is preferable to use electroplating by which the thickness can be adjusted easily and accurately and the second plating layer 22a can be formed in a relatively short period of time.

In the case where the electroless plating is used, its procedure is not particularly limited, and the electroless plating can be performed by the same procedure as that in the case where the metal plating layer 12a is formed. Furthermore, in the case where the electroplating is used, its procedure is not particularly limited, and the electroplating can be performed by the same procedure as that in the case where the metal plating layer 12a is formed.

<Advantages>

In the method for manufacturing a printed circuit board, the printed circuit board can be easily and reliably manufactured. Furthermore, in the method for manufacturing a printed circuit board, in the metal plating layer formation step, by performing a heat treatment after filling with the plating metal, modification of the base film 2 can be promoted to thereby further decrease the external transmittance of the base film 2.

Other Embodiments

It should be considered that the embodiments disclosed this time are illustrative and non-restrictive in all aspects. The scope of the present invention is not limited to the embodiments described above but is defined by the appended claims, and is intended to include all modifications within the meaning and scope equivalent to those of the claims.

For example, the printed circuit board may not necessarily have flexibility. Furthermore, the printed circuit board does not necessarily have a conductive pattern including a copper particle bond layer on only one surface of a base film, and the conductive pattern may be disposed on each of both surfaces of the base film. Furthermore, in the case where the printed circuit board has the conductive patterns on both surfaces of the base film, metal plating layers may be disposed on the outer surfaces of the two copper particle bond layers. In the case where the printed circuit board has the conductive patterns on both surfaces of the base film, the two surface layers of the base film can be modified, and the external transmittance can be further decreased. Furthermore, in the printed circuit board, since the surface layer of the base film is modified, it is possible to prevent a circuit on the other side of the base film from being visually confirmed from one side of the base film. Therefore, it is possible to promote the effect of suppressing the false detection rate for circuit defects.

The middle layer portion of the base film is not necessarily the entire portion excluding the modified surface layer, and the middle layer portion may include a portion other than the modified surface layer.

The printed circuit board is not necessarily formed by a subtractive method, and may be formed by a semi-additive method.

Furthermore, the present invention is also targeted at an electronic component which uses the printed circuit board. Specifically, in the present invention, for example, an electronic component in which the printed circuit board according to any of the embodiments described above is electrically connected to an element, such as a semiconductor device or chip resistor, is also within the intended scope of the invention. Since the electronic component includes the printed circuit board which can reduce the inspection error rate in determination of circuit defects, it is possible to reduce the rate of occurrence of circuit defects.

EXAMPLES

The present invention will be described more in detail on the basis of examples. However, it is to be understood that the present invention is not limited to the examples.

[Nos. 1 to 4]

Copper particles with a mean particle size of 60 nm, which were obtained by a liquid-phase reduction method, were dispersed in water serving as a solvent to prepare an ink having a copper concentration of 26% by mass. Next, a polyimide film with an average thickness of 25 µm was used as a base film, and a wet blast treatment and a plasma treatment were performed in this order on one surface of the polyimide film (hereinafter, the wet blast treatment and the plasma treatment may be collectively referred to as the "surface treatment"). Furthermore, the ink was applied to the one surface of the polyimide film and dried in air to form a coating film. Then, the coating film was fired in a nitrogen atmosphere with an oxygen concentration of 100 ppm by volume for 120 minutes at 350° C. In such a manner, printed circuit board base materials Nos. 1 to 4, each including a copper particle bond layer (average thickness 150 nm) provided on one surface of the polyimide film, were obtained.

Subsequently, electroless copper plating was performed on one surface of the copper particle bond layer of each of the printed circuit board base materials Nos. 1 to 4 to form a first plating layer with an average thickness of 1 µm. Furthermore, copper electroplating was performed to form a second plating layer with an average thickness of Subsequently, the printed circuit board base material provided with the first plating layer and the second plating layer was subjected to a heat treatment in a nitrogen atmosphere with an oxygen concentration of 100 ppm by volume for 120 minutes at 350° C., and then, by using a subtractive method, 10 circuits with an average circuit width of 100 µM, an average circuit spacing of 100 and an average circuit length of 3 cm were formed. Thus, inter-terminal printed circuit boards Nos. 1 to 4 were fabricated. Note that a sodium hydroxide aqueous solution was used as an etchant in the subtractive method.

[No. 5]

A polyimide film with an average thickness of 25 µm was used as a base film, and one surface of the polyimide film was subjected to the same surface treatment as that for Nos. 1 to 4. Furthermore, a rolled copper foil (average thickness 12 µm) was disposed on one surface of the polyimide film by using an adhesive to obtain a printed circuit board base material No. 5. The printed circuit board base material was subjected to a heat treatment in a nitrogen atmosphere with an oxygen concentration of 100 ppm by volume for 120 minutes at 350° C. Then, by using a subtractive method, 10 circuits with an average circuit width of 100 µm, an average circuit spacing of 100 and an average circuit length of 3 cm were formed. Thus, an inter-terminal printed circuit board No. 5 was fabricated. Note that a sodium hydroxide aqueous solution was used as an etchant in the subtractive method.

[Quality of Printed Circuit Board Base Material]
<External Transmittance>

The external transmittance for a wavelength of 500 nm in the base film before the surface treatment was measured on the printed circuit board base materials Nos. 1 to 5. The external transmittance was measured by using a "TLV-304-BP" manufactured by Asahi Spectra Co., Ltd. The measurement results of the external transmittance are shown in Table 1.

TABLE 1

| Printed circuit board base material | External transmittance (%) Before surface treatment |
|---|---|
| No. 1 | 30 |
| No. 2 | 32 |
| No. 3 | 27 |
| No. 4 | 29 |
| No. 5 | 27 |

[Quality of Printed Circuit Board and Evaluation]
<External Transmittance>

The external transmittance for a wavelength of 500 nm in the conductive pattern non-formed region of the base film and at the circuit surface (one surface of the circuit) was measured by the same measuring device as that described above on the printed circuit boards Nos. 1 to 5. The measurement results of the external transmittance are shown in Table 2.

<Lightness and Chromaticity>

The lightness and chromaticities of the non-formed region and the circuit surface were measured on the printed circuit boards Nos. 1 to 5. The lightness and chromaticities were measured, by using a colorimeter ("CR-400" manufactured by KONICA MINOLTA, INC.), in accordance with JIS-Z8781-4 (2013). The measurement results of the lightness and chromaticities are shown in Table 2. Note that the difference in lightness shown in Table 2 refers to the absolute value of the difference between the lightness L* of the circuit surface and the lightness L* of the non-formed region X.

<False Detection Rate for Circuit Defects>

A plurality of each of printed circuit boards Nos. 1 to 5 were prepared, and circuit defects were detected, by using an automated optical inspection system (AOI), on the plurality of printed circuit boards. Next, 100 printed circuit boards each for Nos. 1 to 5 in which circuit defects were detected by the AOI were inspected visually regarding the accurate presence or absence of circuit defects by using an optical microscope. The false detection rate for circuit defects in each of the printed circuit boards Nos. 1 to 5 was calculated in accordance with the formula: (100−A)/100×100 [%], where A is the number of printed circuit boards in which circuit defects were detected by using the optical microscope. The calculation results are shown in Table 2.

TABLE 2

| Printed circuit board | External transmittance (%) | | Lightness L* | | Chromaticity a* | | Chromaticity b* | | Difference in lightness (Lightness L* of circuit surface − Lightness L* of non-formed region) | False detection rate for circuit defects (%) |
|---|---|---|---|---|---|---|---|---|---|---|
| | Non-formed region | Circuit surface | Non-formed region | Circuit surface | Non-formed region | Circuit surface | Non-formed region | Circuit surface | | |
| No. 1 | 10 | 0 | 46.6 | 72.2 | 17.7 | 24.6 | 19.2 | 16.0 | 25.6 | 2 |
| No. 2 | 7 | 0 | 46.3 | 71.6 | 19.4 | 24.0 | 18.8 | 15.6 | 25.3 | 1 |
| No. 3 | 8 | 0 | 44.1 | 71.4 | 19.0 | 24.4 | 19.1 | 10.9 | 27.3 | 3 |
| No. 4 | 7 | 0 | 45.1 | 70.5 | 18.2 | 24.5 | 19.5 | 12.3 | 25.4 | 2 |
| No. 5 | 20 | 0 | 57.3 | 71.1 | 11.8 | 24.3 | 11.8 | 19.3 | 13.8 | 8 |

[Evaluation Results]

As is evident with reference to Tables 1 and 2, in the printed circuit boards Nos. 1 to 4, the external transmittance for a wavelength of 500 nm in the non-formed region is 70% or less of the external transmittance for a wavelength of 500 nm of the base film before the surface treatment in the printed circuit board base material. That is, it is evident that, in the printed circuit boards Nos. 1 to 4, the external transmittance of the base film is largely decreased from the external transmittance of the base film of the printed circuit board base material. In contrast, in the printed circuit board No. 5, the ratio of the external transmittance for a wavelength of 500 nm in the non-formed region of the printed circuit board to the external remittance for a wavelength of 500 nm of the base film before the surface treatment in the printed circuit board base material is high, at 74%. When the cross section in the thickness direction of each of the base films Nos. 1 to 4 was observed with a scanning electron microscope (SEM), it was found that an insulating layer having a different composition from the middle layer portion was formed in a region extending from the surface fixed to the copper particle bond layer to a depth of 10 nm. It is considered from this result that the region having the different composition is a modified surface layer. Note that, in the printed circuit board No. 5, there is no copper particle bond layer, and such a modified surface layer is not observed.

Furthermore, the modified surface layer of each of the printed circuit boards Nos. 1 to 4 was removed by sandblasting to obtain a base film with an average thickness of 20 μm, and the external transmittance ($T_2$) for a wavelength of 500 nm of the base film was measured. Subsequently, the average thickness of the base film was decreased by sandblasting to 10 μm, and the external transmittance ($T_1$) for a wavelength of 500 nm was measured. Then, the internal transmittance (T) of the middle layer portion of the base film was calculated according to the formula: $\log(T) = (\log T_1 - \log T_2) \times 25/(20-10)$. The external transmittance for a wavelength of 500 nm in the non-formed region was 70% or less of the internal transmittance for a wavelength of 500 nm in the middle layer portion of the base film. Furthermore, it was found that the ratio of the external transmittance for a wavelength of 500 nm in the non-formed region to the internal transmittance for a wavelength of 500 nm in the middle layer portion of the base film calculated on the basis of the above formula was substantially equal to the ratio of the external transmittance for a wavelength of 500 nm in the non-formed region of the printed circuit board to the external transmittance for a wavelength of 500 nm of the base film before the surface treatment in the printed circuit board base material.

Furthermore, the external transmittance for a wavelength of 500 nm in the non-formed region of each of the printed circuit boards Nos. 1 to 4 was 7% to 10%, which was 15% or less. In contrast, the external transmittance for a wavelength of 500 m in the non-formed region of the printed circuit board No. 5 was high, at 20%. Furthermore, in each of the printed circuit boards Nos. 1 to 4, the absolute value of the difference between the lightness L* of the circuit surface and the lightness L* of the non-formed region was high, at 15 or more, while in the printed circuit board No. 5, the absolute value of the difference was lower than 15.

Furthermore, it was found that, in the printed circuit boards Nos. 1 to 4, the light transmittance of a region other than the modified surface layer was substantially the same compared with the printed circuit board No. 5, while the external transmittance of the base film was low, and therefore, the inspection error rate in determination of circuit defects was decreased.

The invention claimed is:

1. A printed circuit board comprising:
   a base film containing, as a main component, a polyimide; and
   a conductive pattern disposed on at least one surface of the base film,
   wherein the conductive pattern includes a copper particle bond layer which is fixed to the base film,
   an external transmittance for a wavelength of 500 nm in a conductive pattern non-formed region of the base film is 70% or less of an internal transmittance for a wavelength of 500 nm in a middle layer portion of the base film,
   the copper particle bond layer is a layer including a structure in which a plurality of copper particles adhere and bond together by firing in an atmosphere containing oxygen in the range of 1 ppm by volume to 1,000 ppm by volume and at the firing temperature in the range of 250° C. to 500° C., and
   wherein the middle layer portion of the base film is a portion excluding at least a modified surface layer of the base film, wherein the modified surface layer is a region of the base film extending from a surface of the base film to which the copper particle bond layer is fixed, and having an average thickness of 5 nm or more and 100 nm or less.

2. The printed circuit board according to claim 1, wherein the base film does not substantially contain a pigment.

3. The printed circuit board according to claim 1, wherein the external transmittance for a wavelength of 500 nm in the conductive pattern non-formed region of the base film is 15% or less.

4. The printed circuit board according to claim 1, wherein a copper oxide based on oxidation of the copper particle is dispersed in the modified surface layer.

5. An electronic component comprising the printed circuit board according to claim 1 and an element mounted on the printed circuit board.

* * * * *